United States Patent
Ito

(10) Patent No.: US 10,879,891 B2
(45) Date of Patent: Dec. 29, 2020

(54) POWER SUPPLY VOLTAGE MONITORING CIRCUIT AND CONTROL DEVICE

(71) Applicant: JTEKT CORPORATION, Osaka (JP)

(72) Inventor: Takanori Ito, Nishio (JP)

(73) Assignee: JTEKT CORPORATION, Osaka (JP)

( * ) Notice: Subject to any disclaimer, the term of this patent is extended or adjusted under 35 U.S.C. 154(b) by 0 days.

(21) Appl. No.: 16/851,724

(22) Filed: Apr. 17, 2020

(65) Prior Publication Data
US 2020/0366284 A1 Nov. 19, 2020

(30) Foreign Application Priority Data
May 16, 2019 (JP) ................. 2019-093161

(51) Int. Cl.
| | | |
|---|---|---|
| H03L 7/00 | (2006.01) | |
| H03K 17/22 | (2006.01) | |
| G05F 3/26 | (2006.01) | |
| H02M 3/156 | (2006.01) | |
| G01R 31/40 | (2020.01) | |
| G01R 19/165 | (2006.01) | |
| G06F 1/26 | (2006.01) | |

(52) U.S. Cl.
CPC ......... *H03K 17/223* (2013.01); *G01R 19/165* (2013.01); *G01R 31/40* (2013.01); *G05F 3/262* (2013.01); *G06F 1/26* (2013.01); *H02M 3/156* (2013.01)

(58) Field of Classification Search
CPC ...... H03K 17/22; H03K 17/223; H03K 17/24; G06F 1/24; G06F 1/26; G06F 1/28; G01R 19/165; G01R 31/40; H02M 3/156
See application file for complete search history.

(56) References Cited

U.S. PATENT DOCUMENTS

| | | | |
|---|---|---|---|
| 2004/0012418 A1* | 1/2004 | Kim | H03K 17/223 327/143 |
| 2005/0218969 A1 | 10/2005 | Yoshizawa | |
| 2020/0220535 A1* | 7/2020 | Kawashima | H03K 17/223 |

FOREIGN PATENT DOCUMENTS

JP 2005-291865 A 10/2005

* cited by examiner

*Primary Examiner* — Long Nguyen
(74) *Attorney, Agent, or Firm* — Oblon, McClelland, Maier & Neustadt, L.L.P.

(57) ABSTRACT

A power supply voltage monitoring circuit includes a power supply switching circuit, a series circuit including a first series resistor connected to an input power supply line, a second series resistor connected to a ground potential, and a third series resistor connected between the first series resistor and the second series resistor, a first parallel circuit including a first switching element and connected in parallel to the first series resistor, a second parallel circuit including a second switching element and connected in parallel to the second series resistor, a first determination circuit configured to determine whether a first divided voltage between the first series resistor and the third series resistor is in a normal range, and a second determination circuit configured to determine whether a second divided voltage between the second series resistor and the third series resistor is in a normal range.

4 Claims, 4 Drawing Sheets

US 10,879,891 B2

POWER SUPPLY VOLTAGE MONITORING CIRCUIT AND CONTROL DEVICE

CROSS REFERENCE TO RELATED APPLICATIONS

This application claims priority from Japanese Patent Application No. 2019-093161 filed on May 16, 2019, the entire contents of which are incorporated herein by reference.

BACKGROUND OF THE INVENTION

Field of the Invention

The present invention relates to a power supply voltage monitoring circuit that monitors a power supply voltage and a control device including the same.

Description of Related Art

In related art, a power supply voltage monitoring circuit that monitors a power supply voltage has been known. A power supply voltage monitoring circuit described in Patent Literature 1 is configured such that a power supply voltage divided by a detection resistor R1 and a detection resistor R2 is input to a comparator, and an abnormality of the power supply voltage is detected by comparison with a reference voltage by the comparator.
[Patent Literature 1] JP-A-2005-291865

In the power supply voltage monitoring circuit according to Patent Literature 1, when a failure occurs in one or both of the detection resistor R1 and the detection resistor R2 to cause a disconnection (open) or a short circuit (closed) state, a normal power supply voltage cannot be monitored. Even when the comparator fails, the normal power supply voltage cannot be monitored. Accordingly, even if the power supply voltage monitoring circuit fails and an abnormal power supply voltage is output to a load side, the use may be continued without detecting a failure in the comparator.

SUMMARY

One or more embodiments provide a power supply voltage monitoring circuit capable of detecting occurrence of a failure when the failure occurs in a component of the power supply voltage monitoring circuit.

In an aspect (1), one or more embodiments provide a power supply voltage monitoring circuit including a power supply switching circuit disposed between an input power supply line and an output power supply line and configured to switch a connection state in which the input power supply line and the output power supply line are connected and a disconnection state in which the input power supply line and the output power supply line are disconnected, a series circuit including a first series resistor connected to the input power supply line, a second series resistor connected to a ground potential, and a third series resistor connected between the first series resistor and the second series resistor, a first parallel circuit including a first switching element and connected in parallel to the first series resistor, a second parallel circuit including a second switching element and connected in parallel to the second series resistor, a first determination circuit configured to determine whether a first divided voltage between the first series resistor and the third series resistor is in a normal range, a second determination circuit configured to determine whether a second divided voltage between the second series resistor and the third series resistor is in a normal range, and a drive circuit configured to set the power supply switching circuit to the connection state when the first divided voltage and the second divided voltage are in the normal range, and to set the power supply switching circuit to the disconnection state when the first divided voltage or the second divided voltages is not in the normal range.

In an aspect (2), a control device may include the power supply voltage monitoring circuit according to the aspect (1), and a control unit. The control unit may control open/closed state of each of the first switching element and second switching element. The control unit may detect a failure in the power supply voltage monitoring circuit in a case where a determination result of the first determination circuit is not an error when the first switching element is closed, or a determination result of the second determination circuit is not an error when the second switching element is closed.

According to one or more embodiments, when a failure occurs in a component of the power supply voltage monitoring circuit, occurrence of the failure can be detected.

DETAILED DESCRIPTION

Embodiment

An embodiment of the present invention will be described with reference to the drawings. The embodiment described below is given as an appropriate example for carrying out the present invention and various preferable technical matters are specifically exemplified. However, the technical scope of the present invention is not limited to the specific embodiment.

Figure 1:
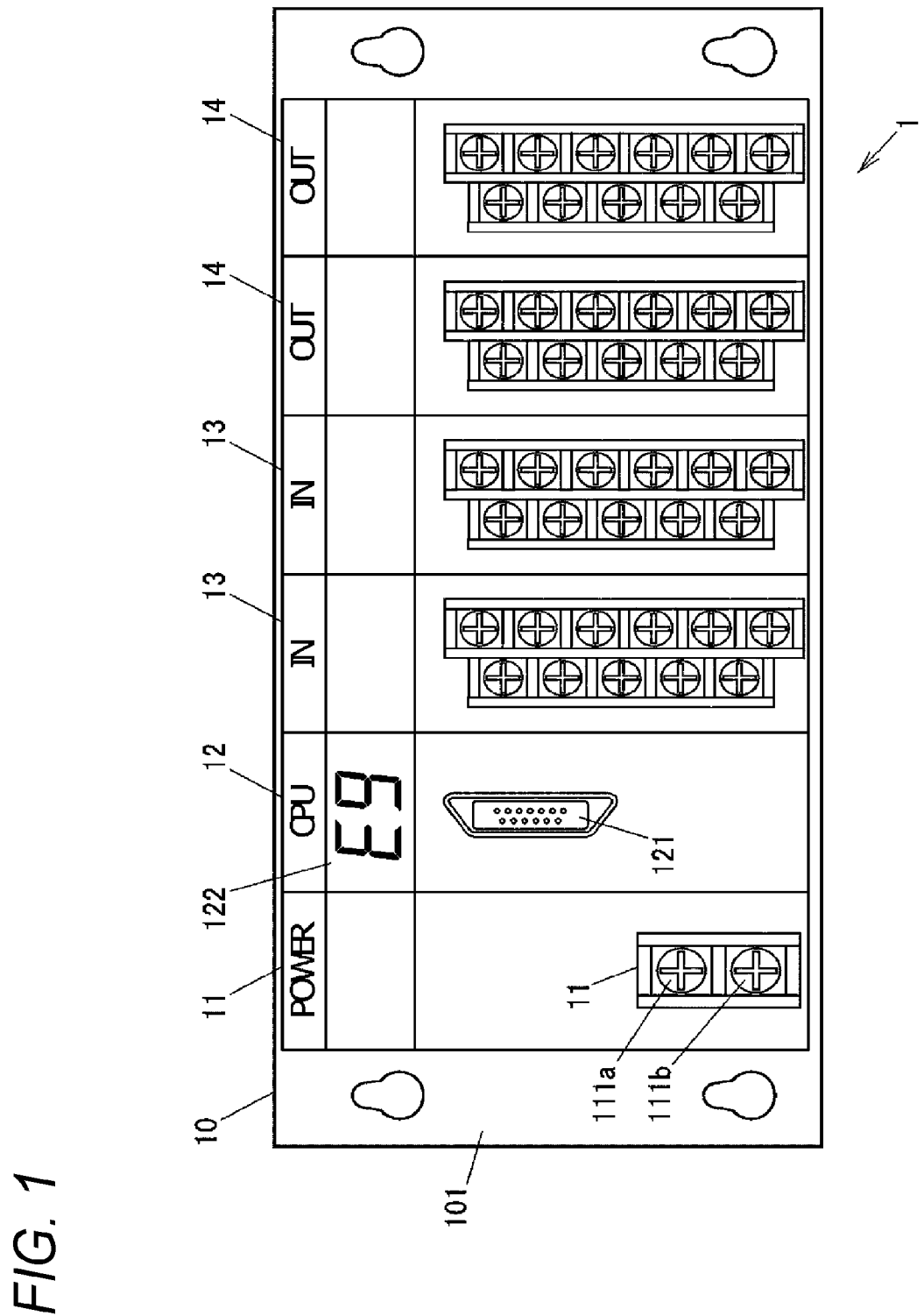
FIG. 1 is a schematic diagram showing a configuration example of a programmable controller as a control device according to the present embodiment.

FIG. 1 is a schematic diagram showing a configuration example of a programmable controller as a control device according to the present embodiment. The programmable controller 1 includes a power supply module 11, a CPU module 12 as a control unit, input modules 13 to which signals from various sensors and switches attached to equipment such as a machine tool to be controlled are input, output modules 14 that output signals for operating an actuator or the like provided in the equipment, and a base module 10 on which these modules 11 to 14 are mounted.

The CPU module 12 includes a connector 121 that connects a peripheral device that writes or reads a sequence program for controlling the equipment, and a display unit 122 that displays an error code and the like described below. The CPU module 12 executes the sequence program with reference to a signal input to an input module 13 to turn ON/OFF a contact of an output module 14 to control the equipment.

The base module 10 includes a plurality of slots to which the modules 11 to 14 are detachably attached. Although FIG. 1 shows the configuration example in which two input modules 13 and two output modules 14 are attached to the base module 10, the number thereof is not limited and, for example, a communication module that communicates with another control device or the like can be attached to the base module 10.

The base module 10 includes a frame 101 for attachment to a control panel or the like, and a printed circuit board (not shown) attached to the frame 101. On the printed circuit board, an output power supply line for power supply from the power supply module 11 to the other modules 12 to 14, a signal line for signal transmission and reception between the modules 11 to 14, and the like are formed by a wiring pattern. The power supply module 11 includes a terminal block 111 having a first terminal 111a and a second terminal 111b, and power of, for example, DC 24 V is supplied to the terminal block 111.

Figure 2:
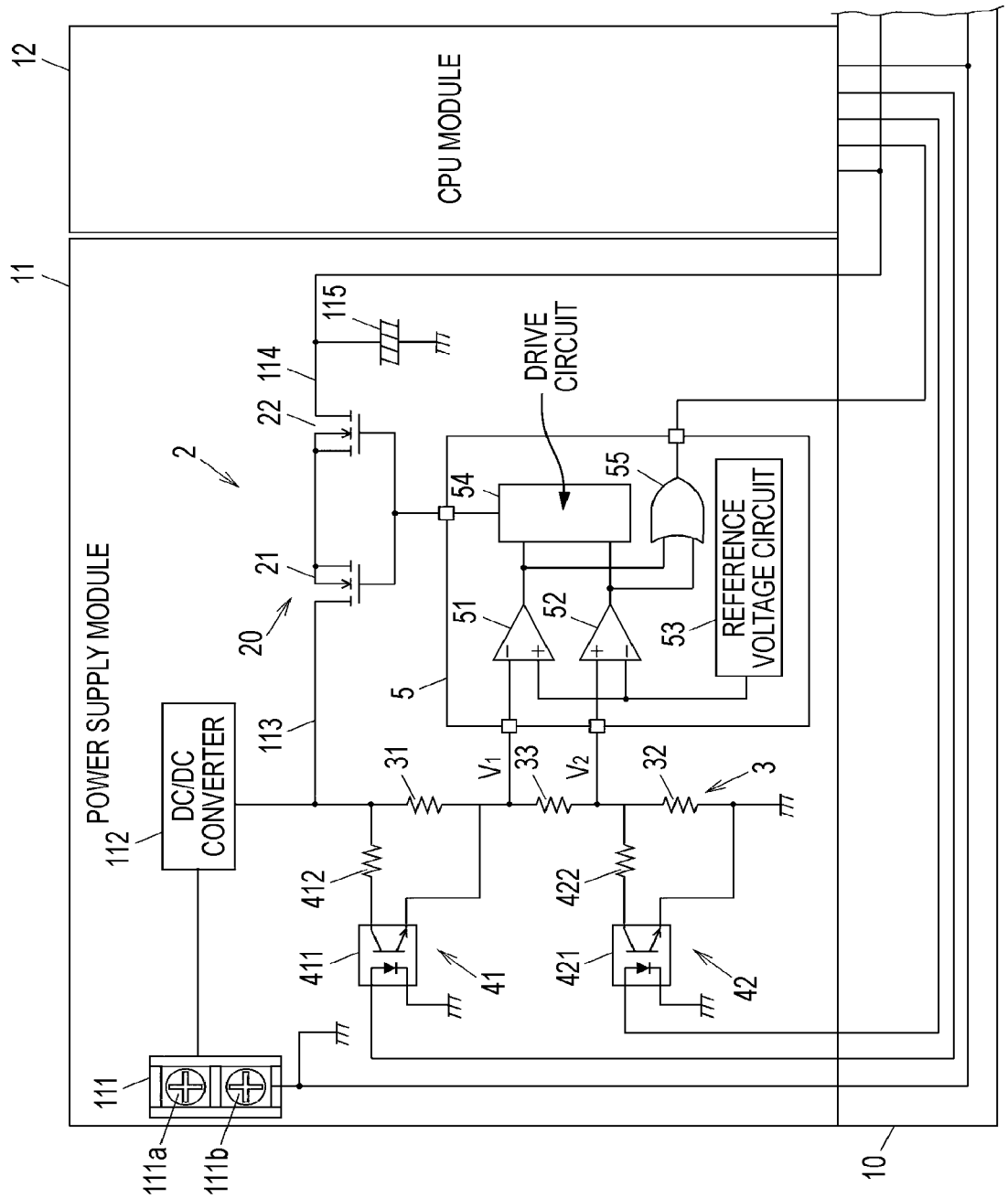
FIG. 2 is a schematic configuration diagram showing a configuration example of a power supply module together with a part of a base module and a CPU module.

FIG. 2 is a schematic configuration diagram showing a configuration example of the power supply module 11 together with a part of the base module 10 and the CPU module 12. The power supply module 11 includes a DC/DC converter 112, and converts a voltage supplied to the terminal block 111 into a voltage suitable as an operating voltage of a microprocessor of the CPU module 12 and electronic components of a peripheral circuit thereof by the DC/DC converter 112. The CPU module 12 and the plurality of input modules 13 and output modules 14 operate with an output voltage of the DC/DC converter 112. These modules 12 to 14 are electric loads for the power supply module 11.

In the present embodiment, a case where a standard value of the output voltage of the DC/DC converter 112 is 3.3 V will be described. The power supply module 11 may be configured such that an AC voltage of, for example, 100 V is supplied to the terminal block 111. In this case, a DC power supply that converts AC 100 V to DC 3.3 V is provided in the power supply module 11.

The power supply module 11 includes a power supply voltage monitoring circuit 2 that monitors the output voltage of the DC/DC converter 112. The power supply voltage monitoring circuit 2 includes a power supply switching circuit 20 disposed between an input power supply line 113 to which a power supply voltage of 3.3 V is supplied from the DC/DC converter 112 and an output power supply line 114 that supplies power to the CPU module 12 and the like. The power supply switching circuit 20 can switch between a connection state in which the input power supply line 113 and the output power supply line 114 are connected and a disconnection state in which the input power supply line 113 and the output power supply line 114 are disconnected. In the present embodiment, the power supply switching circuit 20 includes two n-channel MOSFETs 21, 22. Sources of the n-channel MOSFETs 21, 22 are connected to each other in a back-to-back manner.

The power supply voltage monitoring circuit 2 includes a series circuit 3 including a first series resistor 31 connected to the input power supply line 113, a second series resistor 32 connected to a ground potential, and a third series resistor 33 connected between the first and second series resistors 31, 32. One end of the first series resistor 31 is connected to the input power supply line 113, and the other end thereof is connected to one end of the third series resistor 33. One end of the second series resistor 32 is connected to the ground potential, and the other end thereof is connected to the other end of the third series resistor 33.

The power supply voltage monitoring circuit 2 includes a first parallel circuit 41 connected in parallel to the first series resistor 31, and a second parallel circuit 42 connected in parallel to the second series resistor 32. The first parallel circuit 41 includes a first switching element 411 and a first parallel resistor 412, which are connected in series. The second parallel circuit 42 includes a second switching element 421 and a second parallel resistor 422, which are connected in series.

In the present embodiment, the first and second switching elements 411, 421 are photocouplers, and when a current flows through a light emitting diode to emit light, a closed state in which a current flows between a collector and an emitter of a phototransistor receiving the light is formed. However, the first and second switching elements 411, 421 may be transistors, FETs or relay circuits.

The power supply voltage monitoring circuit 2 includes a first determination circuit 51 that determines whether a first divided voltage $V_1$ between the first series resistor 31 and the third series resistor 33 is in a normal range, a second determination circuit 52 that determines whether a second divided voltage $V_2$ between the second series resistor 32 and the third series resistor 33 is in a normal range, and a reference voltage circuit 53 that generates a reference voltage serving as a reference for determination in the first and second determination circuits 51, 52. In the present embodiment, the first and second determination circuits 51, 52 are formed by comparators. The reference voltage generated by the reference voltage circuit 53 is always constant, and a voltage value thereof is, for example, 0.5 V.

In the first determination circuit 51, the reference voltage is input to a +input terminal, and the first divided voltage $V_1$ is input to a −input terminal. An output voltage of the first determination circuit 51 is at a low level when the first divided voltage $V_1$ is higher than the reference voltage, and is at a high level when the first divided voltage $V_1$ is lower than the reference voltage. As will be described below, a fact that the output voltage of the first determination circuit 51 is at the high level indicates that the first divided voltage $V_1$ is lower than a lower limit of the normal range. That is, the normal range of the first divided voltage $V_1$ is equal to or higher than the reference voltage generated by the reference voltage circuit 53.

In the second determination circuit 52, the second divided voltage $V_2$ is input to a +input terminal, and the reference voltage is input to a −input terminal. An output voltage of the second determination circuit 52 is at the low level when the second divided voltage $V_2$ is lower than the reference voltage, and is at the high level when the second divided voltage $V_2$ is higher than the reference voltage. As will be described below, a fact that the output voltage of the second determination circuit 52 is at the high level indicates that the second divided voltage $V_2$ exceeds an upper limit of the normal range. That is, the normal range of the second divided voltage $V_2$ is equal to or lower than the reference voltage generated by the reference voltage circuit 53.

The power supply voltage monitoring circuit 2 includes a drive circuit 54 to which output voltages of the first and second determination circuits 51, 52 are input, and an OR gate 55. The drive circuit 54 sets the power supply switching circuit 20 to the connection state when both the first and second divided voltages $V_1$, $V_2$ are in the normal range, and sets the power supply switching circuit 20 to the disconnection state when at least one of the first and second divided voltages $V_1$, $V_2$ is not in the normal range. An output voltage of the OR gate 55 is at a high level when the output voltage of any one of the first and second determination circuits 51, 52 is at the high level.

When the output voltages of the first and second determination circuits 51, 52 are both at the low level, the drive circuit 54 supplies a gate voltage to gates of the n-channel MOSFETs 21, 22 of the power supply switching circuit 20. Accordingly, the input power supply line 113 and the output power supply line 114 are electrically connected to each other, and a power supply voltage is supplied from the output power supply line 114 to the CPU module 12 and the like via the base module 10. On the other hand, when any one of the output voltages of the first and second determination circuits 51, 52 is at the high level, the drive circuit 54 does not supply the gate voltage to the n-channel MOSFETs 21, 22. Accordingly, connection between the input power supply line 113 and the output power supply line 114 is cut off, and the power supply voltage is not supplied to the CPU module 12 and the like.

In the present embodiment, the first determination circuit 51, the second determination circuit 52, the reference voltage circuit 53, the drive circuit 54 and the OR gate 55 are configured as one packaged integrated circuit 5. However, the present invention is not limited thereto, and part or all of the first determination circuit 51, the second determination circuit 52, the reference voltage circuit 53, the drive circuit 54 and the OR gate 55 may be configured as individual electronic components.

The output voltage of the OR gate 55 is input to the CPU module 12 via the base module 10. Open/closed state of the first and second switching elements 411, 421 are switched by the CPU module 12. When power is supplied to the terminal block 111 of the power supply module 11, the CPU module 12 confirms that the output voltage of the OR gate 55 is at the high level by temporarily closing the first switching element 411, and confirms that the output voltage of the OR gate 55 is at the high level by temporarily closing the second switching element 412.

This confirmation operation is performed to diagnose that no failure occurs in the power supply voltage monitoring circuit 2, an abnormality is reliably detected by the first determination circuit 51 or the second determination circuit 52 when the power supply voltage output from the DC/DC converter 112 is an abnormal value, and the power supply switching circuit 20 is in the disconnection state. The above confirmation operation may be performed at a timing other than when the power is supplied.

A capacitor 115 is connected to the output power supply line 114, and the power is supplied from the capacitor 115 to the CPU module 12 and the plurality of the input modules 13 and the output modules 14 even when the first and second switching elements 411, 421 are closed by the CPU module 12 and the power supply switching circuit 20 is temporarily in the disconnection state. A capacitor corresponding to the capacitor 115 may be provided in each of the modules 11 to 14. In the present embodiment, the capacitor 115 is an electrolytic capacitor, but is not limited thereto, and may be, for example, an electric double layer capacitor.

In a case where the output voltage of the OR gate 55 is not at the high level when the first switching element 411 is closed or when the second switching element 421 is closed, the CPU module 12 detects occurrence of a failure in the power supply voltage monitoring circuit 2 and notifies the occurrence of an abnormality. In the present embodiment, notification of the abnormality is performed by displaying an error code on the display unit 122 of the CPU module 12 (see FIG. 1). The example shown in FIG. 1 shows a state in which "E9" is displayed as the error code.

An error code in a case where a determination result of the first determination circuit 51 is not negative may be distinguished from an error code in a case where a determination result of the second determination circuit 52 is not negative, or these may be a common error code. A mode of notification of the abnormality is not limited to displaying the error code on the display unit 122, and may be, for example, notification of the occurrence of the abnormality by communicating with the peripheral device connected to the connector 121.

When a resistance value of the first series resistor 31, a resistance value of the second series resistor 32, and a resistance value of the third series resistor 33 are respectively $R_1$, $R_2$, $R_3$, and a voltage of the input power supply line 113 is $V_0$, the first divided voltage $V_1$ and the second divided voltage $V_2$ are respectively obtained by the following equations (1) and (2).

$$V_1 = V_0 \times (R_2 \pm R_3)/(R_1 \pm R_2 \pm R_3) \tag{1}$$

$$V_2 = V_0 \times R_2/(R_1 + R_2 + R_3) \tag{2}$$

Here, in a case where $R_1$, $R_2$, $R_3$ are respectively 7.5 kΩ, 1.3 kΩ, 380Ω, when the voltage $V_0$ of the input power supply line 113 is 3.3 V, the first divided voltage $V_1$ is 0.604 V and the second divided voltage $V_2$ is 0.467 V. In this case, when the reference voltage output by the reference voltage circuit 53 is 0.5 V, the output voltages of the first and second determination circuits 51, 52 are at the low level. The output voltage of the first determination circuit 51 is at the high level when the voltage $V_0$ of the input power supply line 113 falls below 2.73 V (=3.3×0.5/0.604). The output voltage of the second determination circuit 52 is at the high level when the voltage $V_0$ of the input power supply line 113 exceeds 3.53 V (=3.3×0.5/0.467). That is, when the voltage $V_0$ of the input power supply line 113 is 2.73 V or higher and 3.53 V or lower, the power supply switching circuit 20 is in the connection state, and the power supply voltage is output from the output power supply line 114 to the CPU module 12 or the like via the base module 10. That is, an effective range of the power supply voltage supplied to the CPU module 12 and the like is 2.73 V to 3.53V.

When the first switching element 411 is closed, the first parallel resistor 412 is connected in parallel to the first series resistor 31, and when the second switching element 421 is closed, the second parallel resistor 422 is connected in parallel to the second series resistor 32. When a resistance value of the first parallel resistor 412 is $R_4$ and a resistance value of the second parallel resistor 422 is $R_5$, a combined resistance value $R_6$ of the first series resistor 31 and the first parallel resistor 412 and a combined resistance value $R_7$ of the second series resistor 32 and the second parallel resistor 422 are respectively obtained by the following equations (3) and (4).

$$R_6 = R_1 \times R_4/(R_1 + R_4) \tag{3}$$

$$R_7 = R_2 \times R_5/(R_2 + R_5) \tag{4}$$

A second divided voltage $V_2'$ when the first switching element 411 is closed and a first divided voltage $V_1'$ when the second switching element 421 is closed are respectively obtained by the following equations (5) and (6).

$$V_2' = V_0 \times R_2/(R_6 + R_2 + R_3) \tag{5}$$

$$V_1' = V_0 \times (R_7 + R_3)/(R_1 + R_7 + R_3) \tag{6}$$

The resistance value $R_4$ of the first parallel resistor 412 and the resistance value $R_5$ of the second parallel resistor 422 are set such that the second divided voltage $V_2'$ exceeds the reference voltage if the first switching element 411 is closed even when the voltage $V_0$ of the input power supply line 113 is the lower limit (2.73 V) of the effective range, and the first divided voltage $V_1'$ falls below the reference voltage if the second switching element 421 is closed even when the voltage $V_0$ of the input power supply line 113 is the upper limit (3.53V) of the effective range.

For example, when the resistance value $R_4$ of the first parallel resistor 412 is 7.5 kΩ the same as the resistance value $R_1$ of the first series resistor 31 and the voltage $V_0$ of the input power supply line 113 is 2.73 V, the second divided voltage $V_2'$ is 0.654 V (>0.5 V) and the output voltage of the second determination circuit 52 is at the high level. When the resistance value $R_5$ of the second parallel resistor 422 is 1.3 kΩ the same as the resistance value $R_2$ of the second series resistor 32 and the voltage $V_0$ of the input power supply line 113 is 3.53 V, the first divided voltage $V_1'$ is 0.426 V (<0.5 V) and the output voltage of the first determination circuit 51 is at the high level.

In a case where the output voltage of the OR gate 55 is at the high level when the first switching element 411 is closed and the output voltage of the OR gate 55 is at the high level when the second switching element 421 is closed, the CPU module 12 determines that the power supply voltage monitoring circuit 2 operates normally. Otherwise, the CPU module 12 determines that a failure occurs in the power supply voltage monitoring circuit 2 and notifies occurrence of an abnormality. Examples of the cause of the failure in the power supply voltage monitoring circuit 2 include a failure in the integrated circuit 5 and a disconnection (open) or a short circuit (closed) state of any one of the first to third series resistors 31 to 33.

According to the present embodiment, when the first series resistor 31 is disconnected, or when the second series resistor 32 is short-circuited, the voltage of the first divided voltage $V_1$ falls below the reference voltage, and no power supply voltage is output to the CPU module 12 and the like. When the first series resistor 31 is short-circuited, or when the second series resistor 32 is disconnected, or when the third series resistor 33 is short-circuited, the voltage of the second divided voltage $V_2$ exceeds the reference voltage, and no power supply voltage is output to the CPU module 12 or the like. In a case where the third series resistor 33 is disconnected, the output voltage of the OR gate 55 is not at the high level when the first switching element 411 is closed, and the output voltage of the OR gate 55 is not at the high level when the second switching element 421 is closed, so that the CPU module 12 determines that a failure occurs in the power supply voltage monitoring circuit 2.

Even when the output voltage of the first determination circuit 51 or the second determination circuit 52 is always at the low level due to the failure in the integrated circuit 5, for example, the output voltage of the OR gate 55 is not at the high level during the confirmation operation, whereby the failure in the power supply voltage monitoring circuit 2 is detected.

[Modification]

Figure 3:
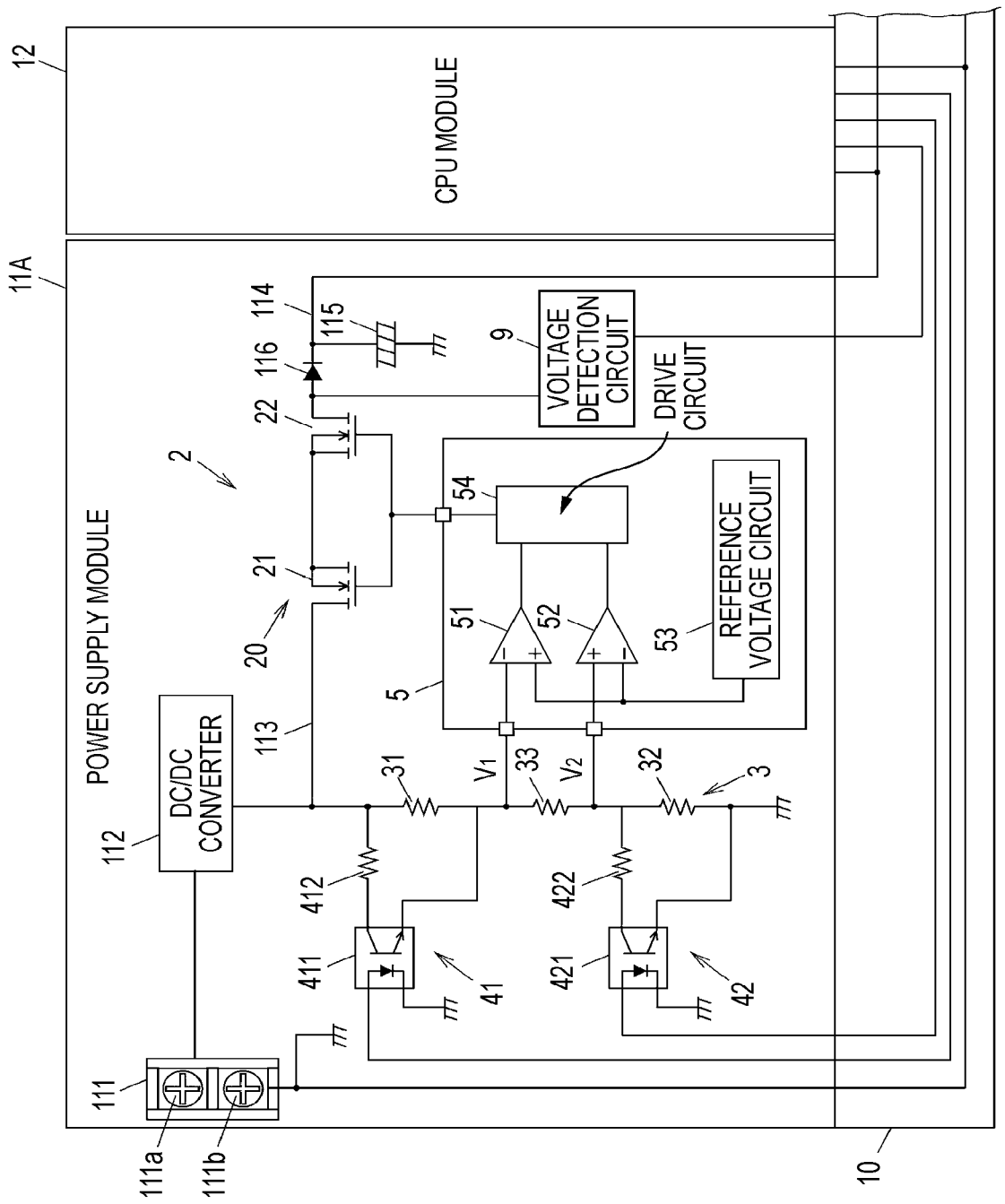
FIG. 3 is a schematic configuration diagram showing a modification of the power supply module together with a part of the base module and the CPU module.

FIG. 3 is a schematic configuration diagram showing a configuration example of a power supply module 11A according to a modification, together with a part of the base module 10 and the CPU module 12. In the example shown in FIG. 2, the output voltages of the first and second determination circuits 51, 52 are input to the OR gate 55, the output voltage of the OR gate 55 is input to the CPU module 12, and in the modification shown in FIG. 3, the integrated circuit 5 does not include the OR gate 55, and presence or absence of a failure in the power supply voltage monitoring circuit 2 is determined based on a detection result of a voltage detection circuit 9.

The voltage detection circuit 9 input a voltage of the output power supply line 114, and outputs a signal indicating the detection result to the CPU module 12 via the base module 10. The voltage detection circuit 9 is, for example, a switch circuit that outputs an ON signal when the input voltage is within a predetermined range and outputs an OFF signal when the input voltage is not within the predetermined range. The predetermined range is an appropriate range of a power supply voltage to be supplied to the CPU module 12 and the like, and is, for example, 2.73 V to 3.53 V. The CPU module 12 determines that the power supply voltage monitoring circuit 2 operates normally in a case where the output signal of the voltage detection circuit 9 is changed from an ON state to an OFF state when the first switching element 411 is closed and when the second switching element 421 is closed.

The voltage detection circuit 9 may be an AD converter. In this case, the voltage detection circuit 9 converts a voltage value of the output power supply line 114 into a digital signal and outputs the digital signal to the CPU module 12. The CPU module 12 determines that the power supply voltage monitoring circuit 2 operates normally in a case where the voltage value of the output power supply line 114 detected by the voltage detection circuit 9 decreases when the first switching element 411 is closed, and the voltage value of the output power supply line 114 detected by the voltage detection circuit 9 decreases when the second switching element 421 is closed.

In the example shown in FIG. 3, a diode 116 is inserted into the output power supply line 114, and an anode of the diode 116 is connected to a n-channel MOSFET 22 and the voltage detection circuit 9, and a cathode thereof is connected to the capacitor 115. The diode 116 is for preventing electric charge stored in the capacitor 115 from affecting the detection result of the voltage detection circuit 9. According to this modification, the failure in the integrated circuit 5 can be reliably detected.

Comparative Example

Figure 4:
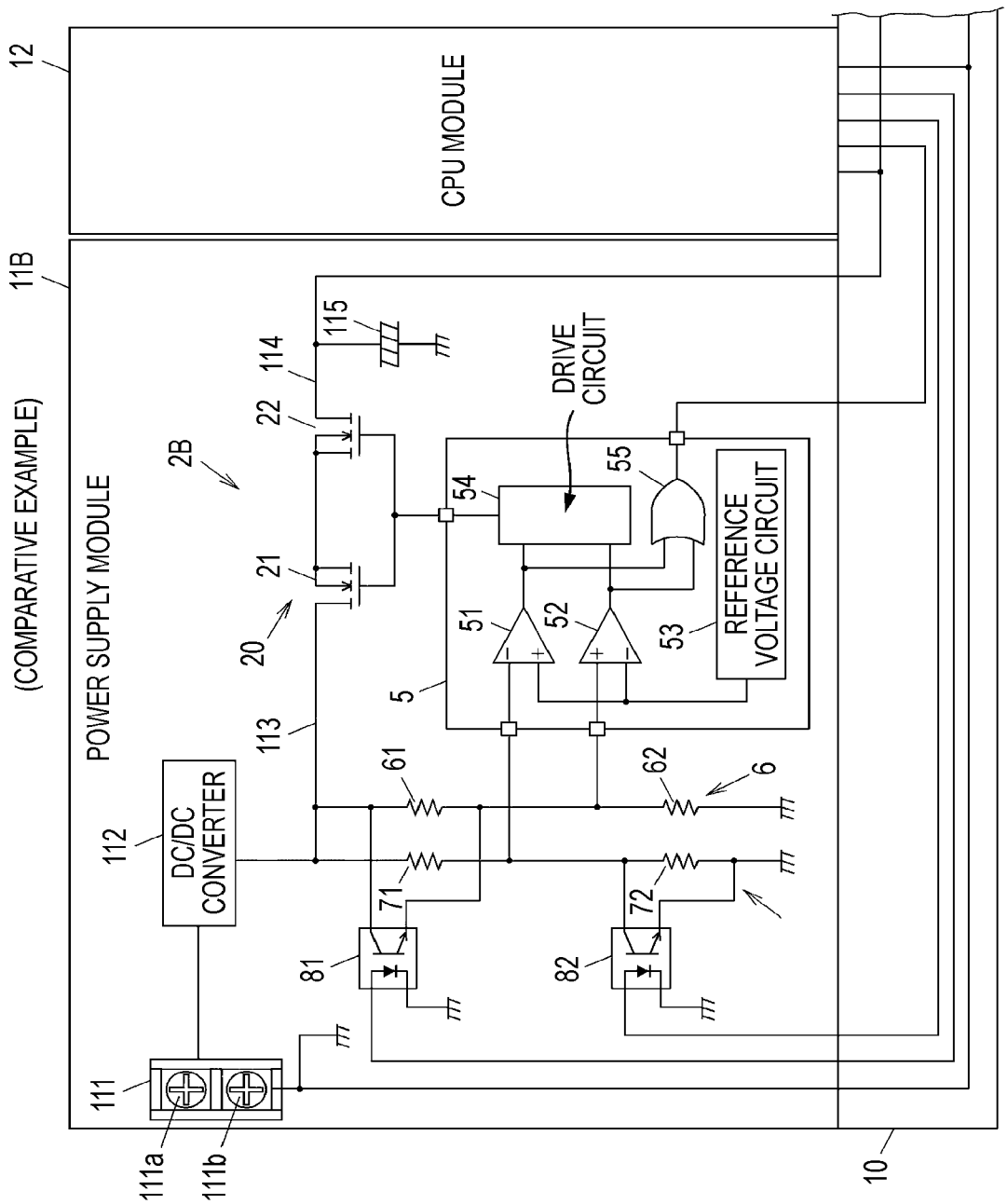
FIG. 4 is a schematic configuration diagram showing a configuration example of a power supply module according to a comparative example together with a part of the base module and the CPU module.

FIG. 4 is a schematic configuration diagram showing a configuration example of a power supply module 11B according to a comparative example together with a part of the base module 10 and the CPU module 12. In FIG. 4, components common to those described in the above embodiment are denoted by the same reference numerals as those in FIG. 2, and repetitive description thereof will be omitted.

The power supply module 11B includes a power supply voltage monitoring circuit 2B that includes the power supply switching circuit 20, the integrated circuit 5, a first series circuit 6 including a first power supply side resistor 61 and a first ground side resistor 62, a second series circuit 7 including a second power supply side resistor 71 and a second ground side resistor 72, and first and second photocouplers 81, 82 as switching elements.

One end of each of the first power supply side resistor 61 and the second power supply side resistor 71 is connected to the input power supply line 113, and one end of each of the first ground side resistor 62 and the second ground side resistor 72 is connected to a ground potential. The first photocoupler 81 is connected in parallel to the first power supply side resistor 61, and the second photocoupler 82 is connected in parallel to the second ground side resistor 72.

Open/closed state of the first and second photocouplers 81, 82 are switched by the CPU module 12.

A first divided voltage between the first power supply side resistor 61 and the first ground side resistor 62 is input to a +input terminal of the second determination circuit 52. A second divided voltage between the second power supply side resistor 71 and the second ground side resistor 72 is input to a −input terminal of the first determination circuit 51. Resistance values of the first power supply side resistor 61, the first ground side resistor 62, the second power supply side resistor 71 and the second ground side resistor 72 are respectively, for example, 68 kΩ, 11 kΩ, 56 kΩ and 12 kΩ.

In the power supply voltage monitoring circuit 2B, an output voltage of the second determination circuit 52 is not at a high level even if the first power supply side resistor 61 is disconnected, a power supply voltage is output while the power supply switching circuit 20 is in a connection state, and the output voltage of the second determination circuit 52 is at the high level when the first photocoupler 81 is closed, so that the CPU module 12 cannot detect a disconnection failure in the first power supply side resistor 61. The output voltage of the second determination circuit 52 is not at the high level even if the second ground side resistor 62 is short-circuited, the power supply voltage is output while the power supply switching circuit 20 is in the connection state, and the input power supply line 113 is grounded when the first photocoupler 81 is closed in a state in which the second ground side resistor 62 is short-circuited, which may cause a new obstacle.

An output voltage of the first determination circuit 51 is not at a high level even if the second power supply side resistor 71 is short-circuited, a power supply voltage is output while the power supply switching circuit 20 is in the connection state, and the input power supply line 113 is grounded when the second photocoupler 82 is closed in a state in which the second power supply side resistor 71 is short-circuited, which may cause a new obstacle. The output voltage of the first determination circuit 51 is not at the high level even if the second ground side resistor 72 is disconnected, the power supply voltage is output while the power supply switching circuit 20 is in the connection state, and the output voltage of the first determination circuit 51 is at the high level when the second photocoupler 82 is closed, so that the CPU module 12 cannot detect a disconnection failure in the second ground side resistor 72.

Operation and Effects of Embodiment

According to the present embodiment, when a failure occurs in the power supply voltage monitoring circuit 2, a situation does not occur in which the CPU module 12 to which power is supplied cannot detect the failure in the power supply voltage monitoring circuit 2. Accordingly, the CPU module 12 can be prevented from continuing to operate in a state in which a power supply voltage outside the effective range is output to the CPU module 12 and the like, and thus safety can be improved.

APPENDIX

Although the present invention has been described above based on the embodiment, the embodiment does not limit the invention according to the claims. Further, it should be noted that not all combinations of the features described in the embodiment are essential to the method for solving the problem of the invention.

In addition, the present invention can be appropriately modified and carried out without departing from the scope of the invention. For example, although a case where the power supply voltage monitoring circuit 2 is applied to the programmable controller 1 has been described in the above embodiment, the power supply voltage monitoring circuit 2 may be applied to various control devices other than the programmable controller. Further, the power supply voltage monitoring circuit 2 can be used in various devices other than the control device.

DESCRIPTION OF REFERENCE NUMERALS AND SIGNS

1 programmable controller (control device)
113 input power supply line
114 output power supply line
12 CPU module (control unit)
2 power supply voltage monitoring circuit
20 power supply switching circuit
31 to 33 first to third series resistors
41, 42 first and second parallel circuits
411, 421 first and second switching elements
412, 422 first and second parallel resistors
51, 52 first and second determination circuits
54 drive circuit

What is claimed is:

1. A power supply voltage monitoring circuit comprising:
   a power supply switching circuit disposed between an input power supply line and an output power supply line and configured to switch a connection state in which the input power supply line and the output power supply line are connected and a disconnection state in which the input power supply line and the output power supply line are disconnected;
   a series circuit including a first series resistor connected to the input power supply line, a second series resistor connected to a ground potential, and a third series resistor connected between the first series resistor and the second series resistor;
   a first parallel circuit including a first switching element and connected in parallel to the first series resistor;
   a second parallel circuit including a second switching element and connected in parallel to the second series resistor;
   a first determination circuit configured to determine whether a first divided voltage between the first series resistor and the third series resistor is in a normal range;
   a second determination circuit configured to determine whether a second divided voltage between the second series resistor and the third series resistor is in a normal range; and
   a drive circuit configured to set the power supply switching circuit to the connection state when the first divided voltage and the second divided voltages are in the normal range, and to set the power supply switching circuit to the disconnection state when the first divided voltage or the second divided voltages is not in the normal range.

2. The power supply voltage monitoring circuit according to claim 1,
   wherein the first parallel circuit includes a first parallel resistor connected in series to the first switching element.

3. The power supply voltage monitoring circuit according to claim 1, wherein the second parallel circuit includes a second parallel resistor connected in series to the second switching element.

4. A control device comprising:

the power supply voltage monitoring circuit according to claim 1; and a control unit, wherein the control unit controls open/closed state of each of the first switching element and the second switching element, and wherein the control unit detects a failure in the power supply voltage monitoring circuit in a case where a determination result of the first determination circuit is not an error when the first switching element is closed, or a determination result of the second determination circuit is not an error when the second switching element is closed.

* * * * *